(12) United States Patent
Arai et al.

(10) Patent No.: US 6,521,866 B1
(45) Date of Patent: Feb. 18, 2003

(54) LASER BEAM MACHINING AND LASER BEAM MACHINE

(75) Inventors: Kunio Arai, Atsugi (JP); Humio Watanabe, Atsugi (JP)

(73) Assignee: Hitachi Via Mechanics, Ltd., Ebina (JP)

(*) Notice: Subject to any disclaimer, the term of this patent is extended or adjusted under 35 U.S.C. 154(b) by 0 days.

(21) Appl. No.: 09/623,809

(22) PCT Filed: Jan. 13, 2000

(86) PCT No.: PCT/JP00/00124
§ 371 (c)(1),
(2), (4) Date: Sep. 8, 2000

(87) PCT Pub. No.: WO00/41839
PCT Pub. Date: Jul. 20, 2000

(30) Foreign Application Priority Data

| Jan. 14, 1999 | (JP) | ............................................. 11-008252 |
| Jan. 12, 2000 | (JP) | ....................................... 2000-003698 |

(51) Int. Cl.[7] .......................... B23K 26/38; B23K 26/06
(52) U.S. Cl. ................................. 219/121.73; 219/121.7
(58) Field of Search ....................... 219/121.73, 121.77, 219/121.7, 121.71, 121.74, 121.75; 359/305

(56) References Cited

U.S. PATENT DOCUMENTS

| 4,468,551 | A | * | 8/1984 | Neilheisel | |
| 4,645,900 | A | * | 2/1987 | Heyden | |
| 5,067,798 | A | * | 11/1991 | Tomoyasu | .................. 359/305 |
| 5,302,798 | A | * | 4/1994 | Inagawa et al. | ........ 219/121.77 |
| 5,910,262 | A | * | 6/1999 | Baumgart et al. | ..... 219/121.77 |
| 6,034,349 | A | * | 3/2000 | Ota | ........................ 219/121.73 |
| 6,037,103 | A | * | 3/2000 | Hino | |
| 6,180,913 | B1 | * | 1/2001 | Kolmeder et al. | ..... 219/121.77 |

* cited by examiner

Primary Examiner—Geoffrey S. Evans
(74) Attorney, Agent, or Firm—Crowell & Moring LLP

(57) ABSTRACT

Beam distributing/shaping units 21a and 21b the number of which is the same as the number of heads 7a and 7b are disposed in series with each other on an optical path of a laser beam 2 radiated from a laser oscillator 1. Then, the beam distributing/shaping units 21a and 21b are operated so that a laser pulse is supplied to one of the heads which has been positioned. By selecting the timing for operating the beam distributing/shaping units 21a and 21b, the laser beam 2 having energy the magnitude of which is substantially fixed is supplied to a portion to be machined. Thus, the laser oscillator is used effectively, and the machining energy is controlled accurately so that a high-quality hole can be machined.

2 Claims, 11 Drawing Sheets

FIG. 5
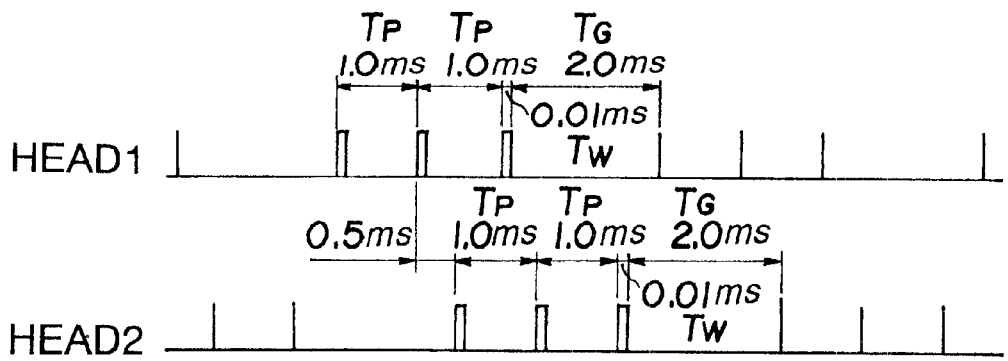
(a)
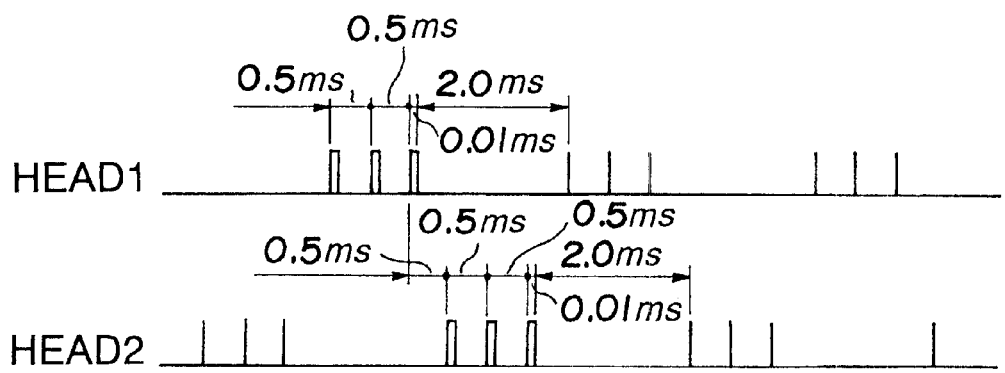
(b)
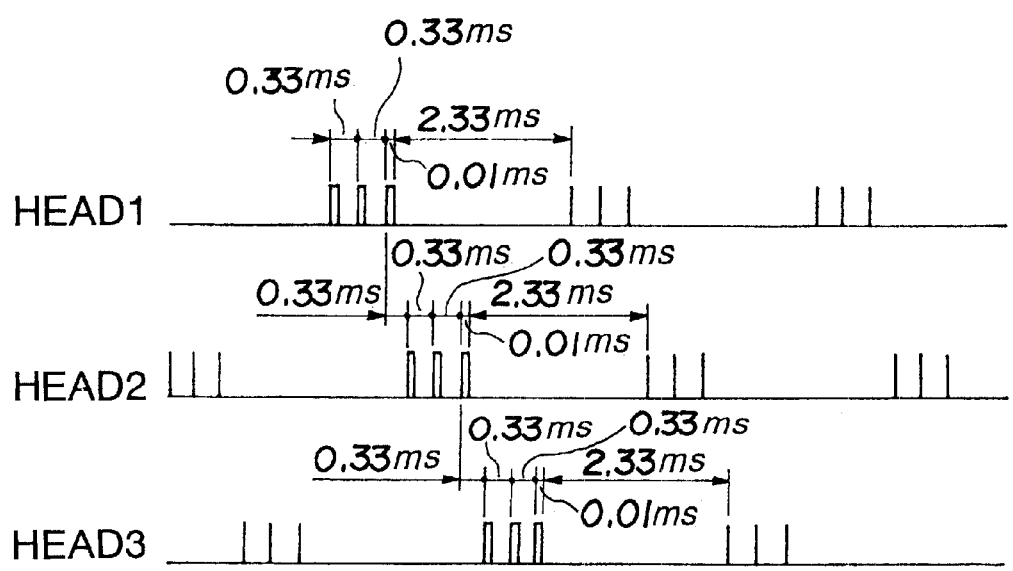
(c)

FIG. 6
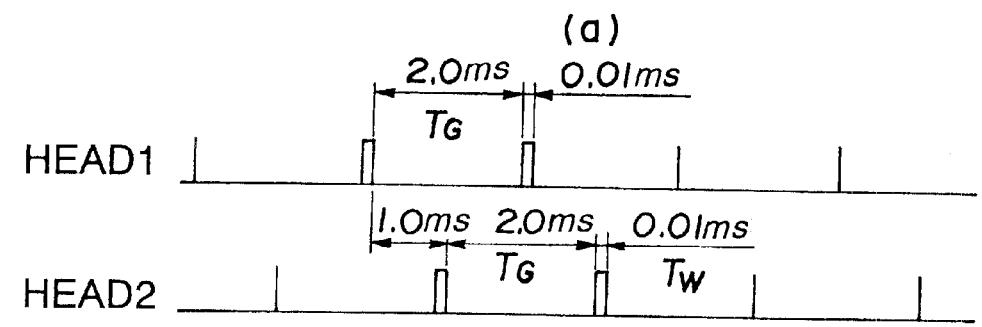
(a)
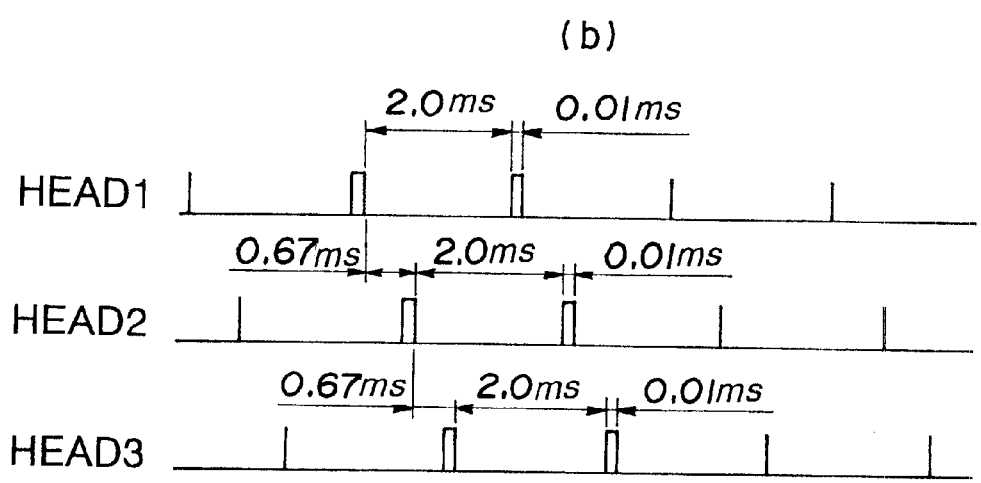
(b)
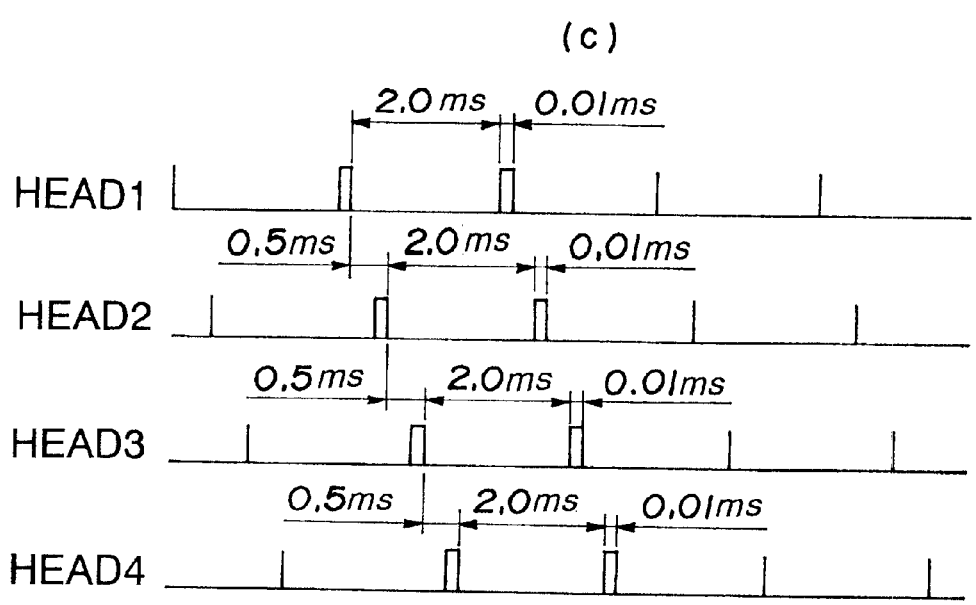
(c)

F I G. 1 0
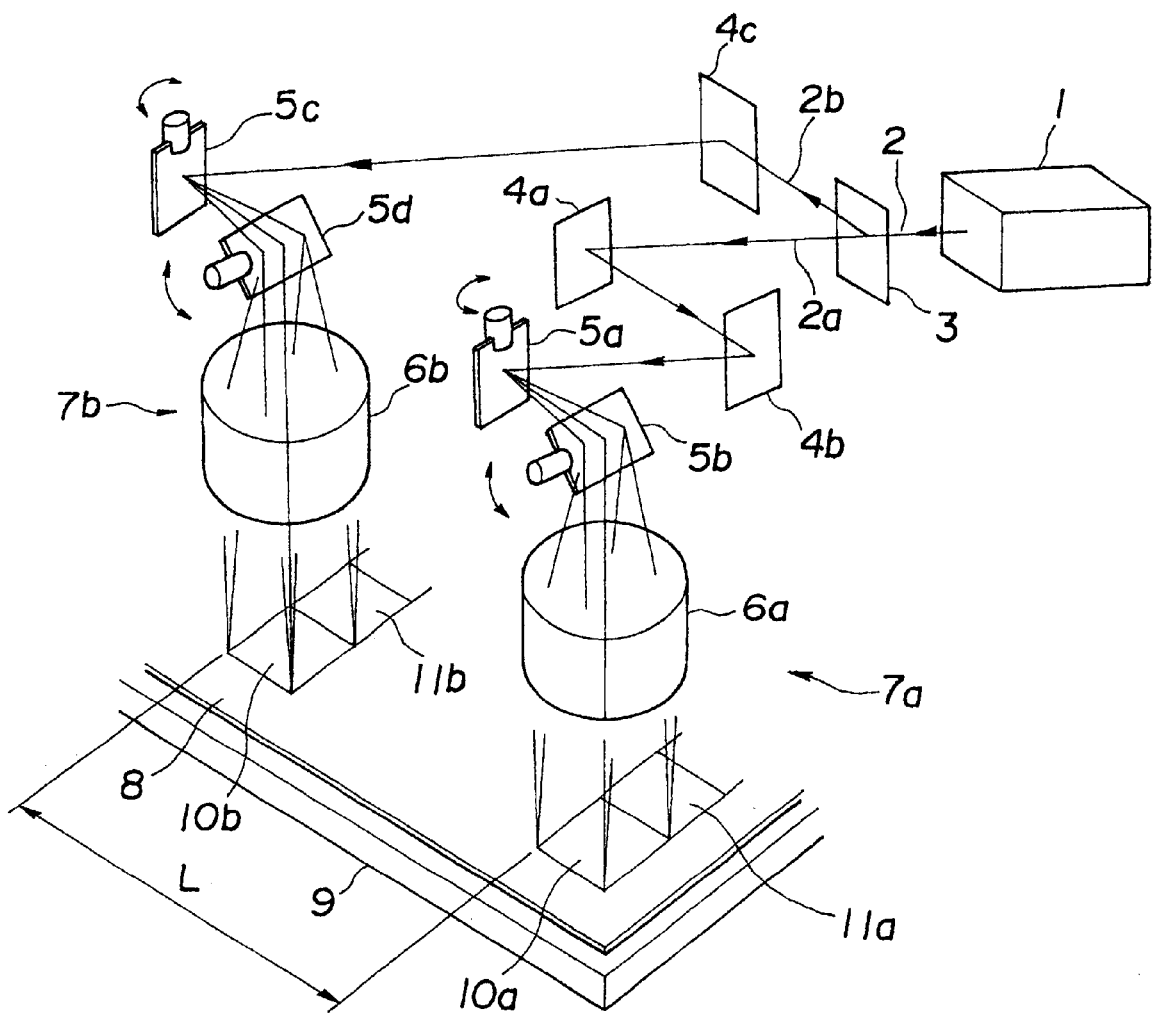

LASER BEAM MACHINING AND LASER BEAM MACHINE

TECHNICAL FIELD

The present invention relates to a laser machining method and a laser machine, and particularly relates to a laser machining method and a laser machine suitable for machining a printed board.

BACKGROUND ART

When a blind hole (hereinafter simply referred to as "hole") for making a connection between layers is machined by a laser beam in a built-up type printed board, a conformal mask method or a direct method is adopted. In the case of the conformal mask method, an insulating layer is irradiated with a laser beam through an etching window which is formed by removing an outer-layer copper foil by etching in advance. On the other hand, in the case of the direct method, an insulating layer having no outer-layer copper foil is irradiated with a laser beam directly. Thus, the insulating layer formed of resin containing glass reinforced fiber or filler is removed by the laser energy. In some laser machines, a laser beam outputted from a laser oscillator is supplied to a plurality of machining heads so that the machining speed is enhanced. Such a laser machine will be described with reference to FIG. 10.

FIG. 10 is a configuration view of a background-art laser machine. A laser oscillator 1 outputs a pulsed laser beam 2. A half mirror 3 transmits about 50% of the laser beam 2 incident thereto and reflects the rest of the laser beam 2. Hereinafter, the laser beam 2 transmitted through the half mirror 3 will be referred to as a transmitted beam 2a, and the laser beam 2 reflected on the half mirror 3 will be referred to as a reflected beam 2b. The reflecting surfaces of total reflection corner mirrors 4a to 4c are fixed. As indicated by the arrows in FIG. 10, galvanomirrors 5a to 5d rotate desirably around the rotation axes thereof so that the reflecting surfaces thereof can be positioned at desired angles respectively. Condensing lenses (fθ lenses) 6a and 6b are held by a first machining head 7a and a second machining head 7b respectively. A printed board 8 is fixed to an X-Y table 9. A scan area 10a of the galvanomirrors 5a and 5b and a scan area 10b of the galvanomirrors 5c and 5d measure about 50 mm by 50 mm respectively.

Next, the operation of the background-art laser machine will be described.

The laser beam 2 outputted from the laser oscillator 1 is split into the transmitted beam 2a and the reflected beam 2b by the half mirror 3. The transmitted beam 2a is reflected by the total reflection corner mirrors 4a and 4b to be made incident onto the galvanomirror 5a, passed through an optical path defined by the galvanomirrors 5a and 5b, and condensed by the condensing lens 6a so as to machine a hole in the scan area 10a. The reflected beam 2b is reflected by the total reflection corner mirrors 4c to be made incident onto the galvanomirror 5c, passed through an optical path defined by the galvanomirrors 5c and 5d, and condensed by the condensing lens 6b so as to machine a hole in the scan area 10b. Then, the galvanomirrors 5a to 5d are operated so that the machining head 7a machines the hole in the scan area 10a and the machining head 7b machines the hole in the scan area 10b, sequentially. After the holes in the scan areas 10a and 10b have been machined down, the X-Y table 9 is moved so that machining in the next scan areas 11a and 11b is performed. Incidentally, a distance L between the machining head 7a and the machining head 7b is designed to be adjustable. The distance L is adjusted in advance so that the scan area 10a and the scan area 10b are not put on each other and the number of times to move the X-Y table 9 is minimized.

Incidentally, in order to machine a hole, a plurality of pulsed laser beams 2 (hereinafter, a pulse of laser beam will be referred to as a "laser pulse") are often radiated. A machining method in which a plurality of laser pulses are radiated continuously for one hole and the next hole is machined after the preceding hole has been machined down, is called "burst machining". A machining method in which a plurality of holes are grouped into one set, every hole in one set is irradiated with one laser pulse, and this operation is repeated till the holes in the one set have been machined down, is called "cycle machining".

FIG. 11 is a timing chart of respective portions in the cycle machining; (a) designates a start signal for the laser oscillator 1; (b) designates the magnitude of energy of the laser beam 2; (c) designates the magnitude of energy of the transmitted beam 2a; (d) designates a positioning signal for the galvanomirrors 5a and 5b; (e) designates the magnitude of energy of the reflected beam 2b; and (f) designates a positioning signal for the galvanomirrors 5c and 5d.

When the start signal is turned ON (at time T0), the radiation of the laser beam 2 is started after a delay period $T_{DL}$ of several μs has passed (at time T1, in this case, $T_{DL}$). The magnitude of the energy increases gradually and reaches substantially a peak value $W_P$ after a rising period $T_R$ has passed (at time T2). When the start signal is turned OFF after a pulse period $T_P$ has passed since the time T0 (at time T3), the energy decreases gradually and reaches 0 after a falling period $T_D$ has passed (at T4). Then, the galvanomirrors 5a to 5d are operated during a period $T_G$ after the time T5 so as to be positioned in the next machining positions. After the positioning is completed (at time T6), the start signal is turned ON again (at time T7). The above-mentioned operation is repeated hereafter. In this case, since the transmitted beam 2a and the reflected beam 2b are obtained by splitting the laser beam 2, each of the beams 2a and 2b has energy the peak value of which is $W_P/2$. Incidentally, if the time T5 is set to be simultaneous with the time T4, and if the time T7 is set to be simultaneous with the time T6, the machining speed can be accelerated.

The laser pulse period during which the laser oscillator can oscillate is 0.33 ms (frequency: 3 kHz), and the pulse period $T_P$ is several tens of μs. On the other hand, the period $T_G$ required for positioning the galvanomirrors 5c and 5d is about 2 ms, and the period required for positioning the table is about 200 ms. Therefore, burst machining can accelerate increase the machining speed in comparison with cycle machining.

However, in the case where burst machining is performed by the conformal mask method, if the pulse period is set to be not longer than 2 ms, decomposed flying matters generated by a laser pulse previously radiated remain inside and near the hole. Then, the remaining decomposed flying matters absorb the energy of a succeeding laser pulse so as to be high-temperature plasma. Thus, the resin in the flank of the hole is hollowed so that the diameter of the intermediate portion of the hole in the direction of depth is expanded to be larger than the diameter of the upper or lower portion. Thus, the hole is formed into a so-called barrel-like hole, so that the quality of the hole deteriorates.

Moreover, in the case where burst machining is performed by the direct machining method, if the insulating material is of FR-4 which contains glass reinforced fibers, only the resin is hollowed due to the difference in decomposition energy between the resin and the glass (resin:glass=1:3 to 4). Thus, the glass fibers project over the flank of the hole so that the quality of the hole deteriorates.

Further, even in a laser of RF excitation which rises quickly, the period $T_R$ to reach the peak value $W_P$ is about 15 μs as shown in FIG. 11. Thus, it is impossible to obtain the peak value $W_P$ in a range where the pulse width is not longer than 15 μs.

In addition, since the falling period $T_D$ after the start signal is turned OFF is in a range of from 30 μs to 50 μs, the real pulse width becomes longer than the set pulse width $T_P$ so that the supplied energy becomes excessive. If excessive energy is supplied, a resin residue remains on the bottom surface of the hole, the surface roughness of the internal wall becomes large, or the internal wall is carbonized. In either case, the quality of the hole deteriorates. In addition, there is a fear that the copper foil of the internal layer is damaged or the resin on the back of the copper foil is peeled off.

Further, in order to obtain N split beams on the assumption that the peak value per head required for machining is $W_P$, the laser oscillator must have a large capacity and the peak value of $NW_P$, that is, N times as large as $W_P$.

In addition, in the case where a laser beam is split by a half mirror, the transmitted beam 2a and the reflected beam 2b are produced simultaneously, so that a time difference cannot be given between the transmitted beam 2a and the reflected beam 2b. Therefore, the number of spots to be machined in the scan area 10a must be the same as that in the scan area 10b. Thus, the kind of the printed board which can be machined is limited. In addition, it is difficult to make the number of heads odd.

It is an object of the present invention to solve the foregoing problems in the background art and to provide a laser machining method and a laser machine in which a laser oscillator is used effectively and machining energy is controlled accurately so that holes which are superior in quality can be machined.

DISCLOSURE OF THE INVENTION

In order to achieve the above object, the present invention is designed such that optical path deflecting means for deflecting an optical path of laser beam is disposed on the optical path of the laser beam, and laser energy supplied to a portion to be machined is controlled by the optical path deflecting means.

In this case, a pulsed laser beam is used, and the laser beam supplied to the aforementioned portion to be machined is formed to have a substantially rectangular waveform. In addition, one pulse laser beam outputted from a laser oscillator is time-divided, and the portion to be machined is irradiated with the time-divided pulsed laser beam.

In addition, the present invention is also designed such that; in a laser machine in which laser beam outputted from a laser oscillator is supplied to a plurality of machining heads; optical path deflecting means for deflecting an optical path of laser beam are provided, the number of the optical path deflecting means being equal to the number of the machining heads; the optical path deflecting means are disposed on the optical path; and pulsed laser beam is supplied to one of the machining heads.

In this case, apparatus of an acousto-optic system is used as each of the optical path deflecting means. In addition, the optical path deflecting means are disposed in series with each other on the optical path of the laser beam. Polygonal mirrors may be used as the optical path deflecting means.

BRIEF DESCRIPTION OF THE DRAWINGS

FIG. 5 is a timing chart showing an example of machining when burst machining is performed by a direct method according to the present invention;

FIG. 6 is a timing chart showing an example of machining when cycle machining is performed by a conformal mask method according to the present invention;

FIG. 10 is a configuration view of a background-art laser machine; and

THE BEST MODE FOR CARRYING OUT THE INVENTION

Figure 1:
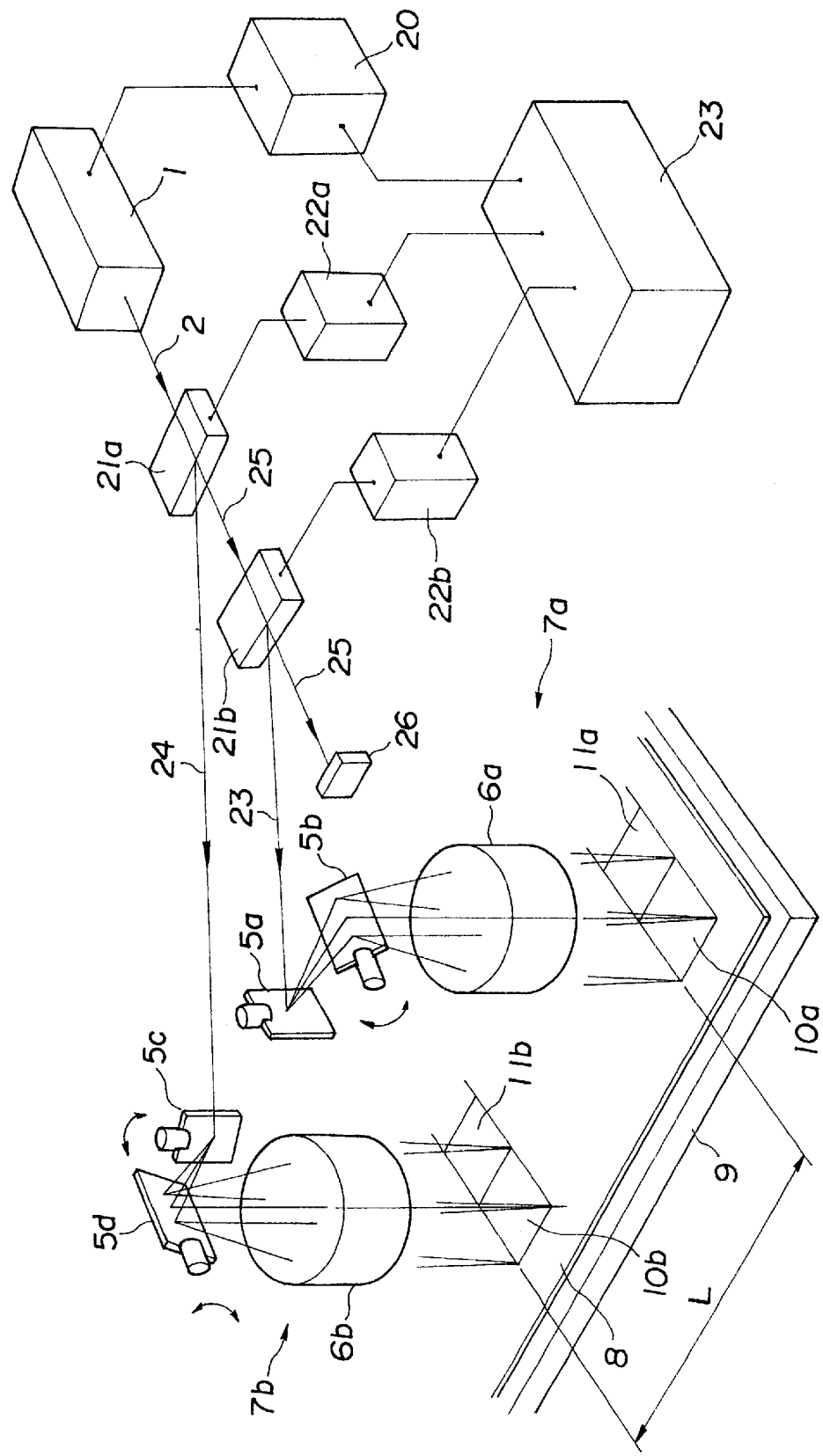
FIG. 1 is a configuration view of a laser machine according to the present invention.

The present invention will be described below on the basis of an embodiment shown in the drawings.

Figure 8:
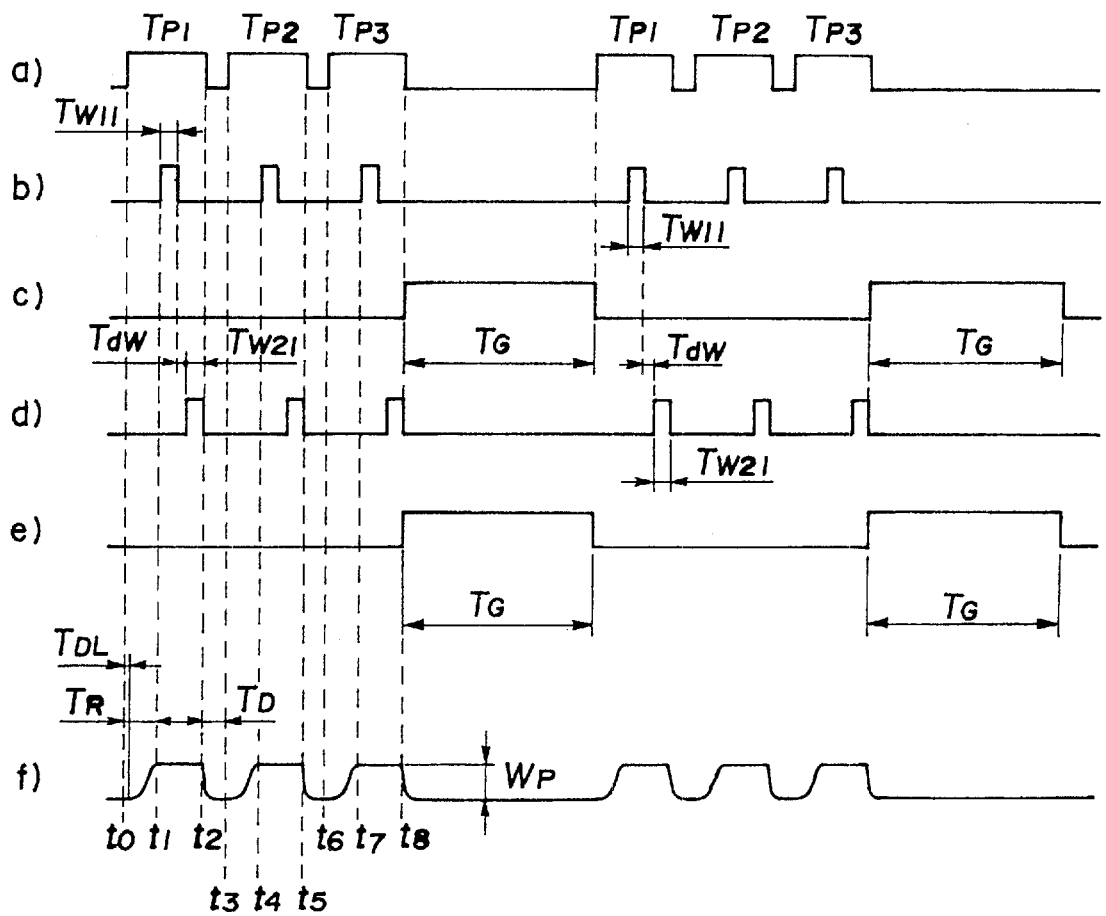
FIG. 8 is a timing chart showing the operation timing of respective portions in burst machining according to the present invention.

FIG. 1 is a configuration view of a laser machine according to the present invention. In FIG. 1, parts which are the same as or have the same functions as those in FIG. 8 are referenced correspondingly, and the description of the parts will be omitted. A power supply/controller 20 performs control and power supply for a laser oscillator 1. Beam distributing/shaping units 21a and 21b are disposed at predetermined angles with respect to an optical path of a pulse beam 2 respectively. Power supply/controllers 22a and 22b perform control and power supply for the beam distributing/shaping units 21a and 21b respectively. An NC unit 23 controls the power supply/controllers 20, 22a and 22b, galvanomirrors 5a to 5d, not-shown drive units on a table 9, and so on. Laser beams 23 to 25 are outputted from the beam distributing/shaping units 21a and 21b. The reference numeral 26 represents a heat gathering unit.

Figure 2:
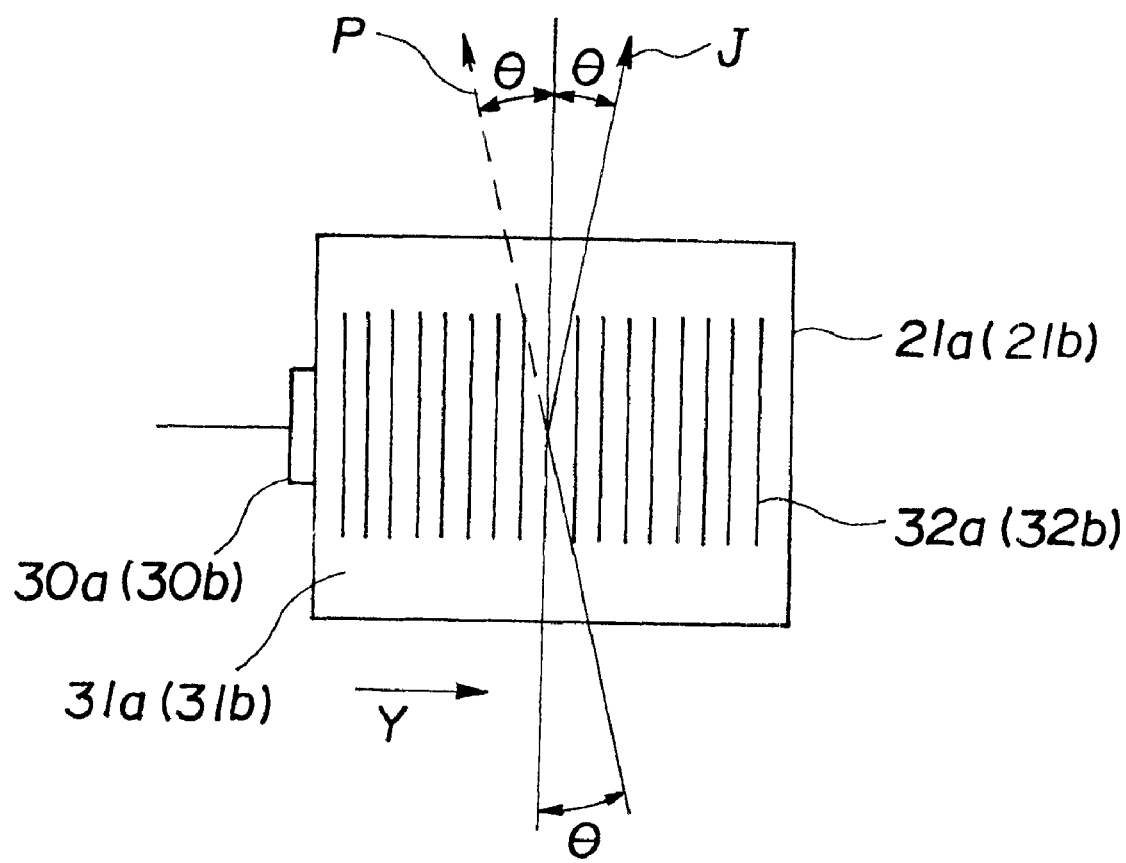
FIG. 2 is a configuration view of a beam distributing/shaping unit.

FIG. 2 is a configuration view of the beam distributing/shaping unit 21a (21b). The beam distributing/shaping unit 21a (21b) is constituted by a transducer 30a (30b) and a crystal medium (for example, germanium) 31a (31b). As will be described later, phase lattice wave surfaces 32a (32b) are formed in the inside of the beam distributing/shaping unit 21a (21b).

First, the operation of the beam distributing/shaping units 21a and 21b will be described. Incidentally, the beam distributing/shaping units 21a and 21b have the same structure. Therefore, description will be made here without using the suffixes a and b.

When a predetermined ultrasonic generating voltage is applied to the transducer 30, an acoustic elastic wave advancing in the direction of the arrow Y is generated in the crystal medium 31, and phase lattice wave surfaces 32 having the same intervals as an ultrasonic wave are formed in the inside of the crystal medium 31 by photo-elastic effect. Thus, the refractive index of the crystal medium 31 changes. Then, if a laser beam enters the phase lattice wave surface 32 at an angle θ which satisfies the Bragg condition (cos θ=λ/2Λ, where λ designates the laser wavelength and Λ designates the phase lattice interval), the transmitted and reflected beam J (first-order diffracted light) outgoes at an outgoing angle of −θ. On the other hand, when no ultrasonic wave generating voltage is applied to the transducer 30, there outgoes the transmitted beam P (zero-order diffracted light with an outgoing angle of 0) which has proceeded straightly in the crystal medium 31.

Incidentally, the optical paths of the incident beam, the transmitted beam P and the transmitted and reflected beam J are shifted inside the crystal body 31 due to the refractive index of the crystal body 31. However, the quantities of these shifts are small and take fixed values respectively. Therefore, the shifts are omitted in the drawing. Then, the time to form the phase lattice wave surfaces 32 after the ultrasonic wave generating voltage is applied and the time for the phase lattice wave surfaces 32 to vanish after applying the ultrasonic wave generating voltage is stopped, are not longer than 1 μs, respectively.

In this embodiment, a $CO_2$ laser oscillator is used as the laser oscillator 1; germanium, as the crystal medium 31; and surface acoustic wave crystal $LiNbO_3$, as the transducer 30. In this case, the ultrasonic wave frequency is 40 MHz, and θ is 2.2 degrees when the laser wavelength is 10.6 μm, and 1.95 degrees when the laser wavelength is 9.4 μm. The beam distributing/shaping units 21a and 21b are disposed so that the phase lattice wave surfaces 32 to be formed are inclined at the angle θ with respect to the optical axis of the laser oscillator 1.

Next, the operation of this embodiment will be described about the case of cycle machining.

Figure 3:
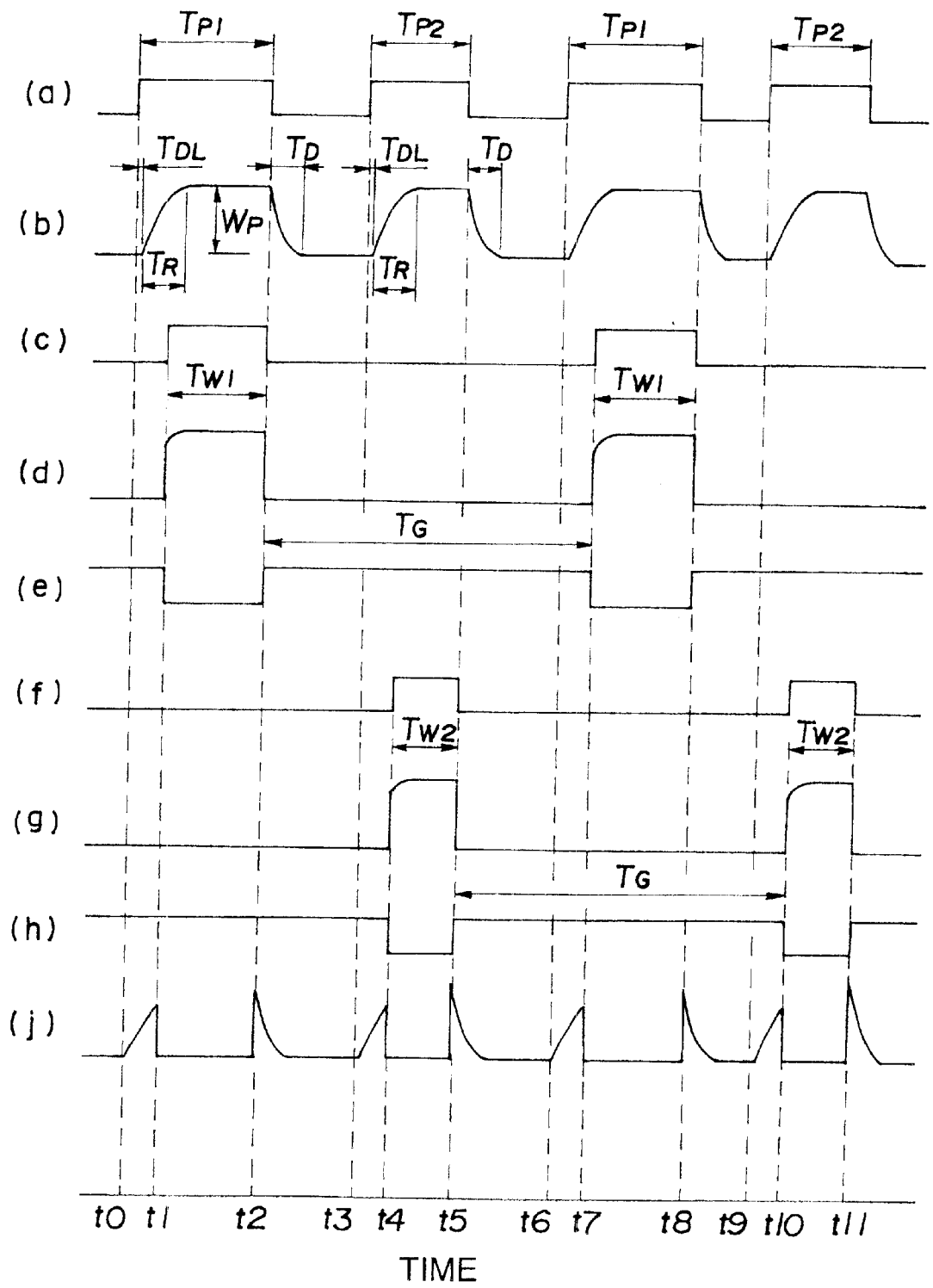
FIG. 3 is a timing chart showing the operation timing of respective portions when cycle machining according to the present invention is performed.

FIG. 3 is a timing chart of respective portions in the case where cycle machining is performed. In FIG. 3, (a) designates a start signal for the laser oscillator; (b) designates the energy of a laser beam 2; (c) designates a start signal for the beam distributing/shaping unit 21b; (d) designates the energy of a laser beam 23; (e) designates a positioning signal for the galvanomirrors 5a and 5b; (f) designates a start signal for the beam distributing/shaping unit 21a; (g) designates the energy of a laser beam 24; (h) designates a positioning signal for the galvanomirrors 5c and 5d; and (j) designates the energy of a laser beam 25.

The NC unit 7 turns the laser oscillator 1 ON in a period $T_{P1}$ (from time t0 to time t2 and from time t6 to time t8) and in a period $T_{P2}$ (from time t3 to time t5 and from time t9 to time t11). After a delay period $T_{DL}$ has passed since any of the periods $T_{P1}$ and $T_{P2}$ was started, the energy of the laser beam 2 increases gradually. After a period $T_R$ has passed, the energy of the laser beam 2 reaches a peak value $W_P$. Then, after any of the periods $T_{P1}$ and $T_{P2}$ was terminated, the energy of the laser beam 2 decreases gradually. After a period $T_D$ has passed, the energy of the laser beam 2 reaches 0.

The beam distributing/shaping unit 21a is turned ON from time t1 and t7 when the energy of the laser beam 2 substantially reaches the peak value $W_P$ to the time t2 and the time t8 when the laser oscillator 1 is turned OFF. The laser beam 23 is outputted while the beam distributing/shaping unit 21a is in ON state. The galvanomirrors 5a and 5b operate except when the beam distributing/shaping unit 21a is in ON state.

The beam distributing/shaping unit 21b is turned ON from time t4 and t10 when the energy of the laser beam 2 substantially reaches the peak value WP to the time t5 and the time t11 when the laser oscillator 1 is turned OFF. The laser beam 24 is outputted while the beam distributing/shaping unit 21b is in ON state. The galvanomirrors 5c and 5d operate except when the beam distributing/shaping unit 21b is in ON state.

Figure 4:
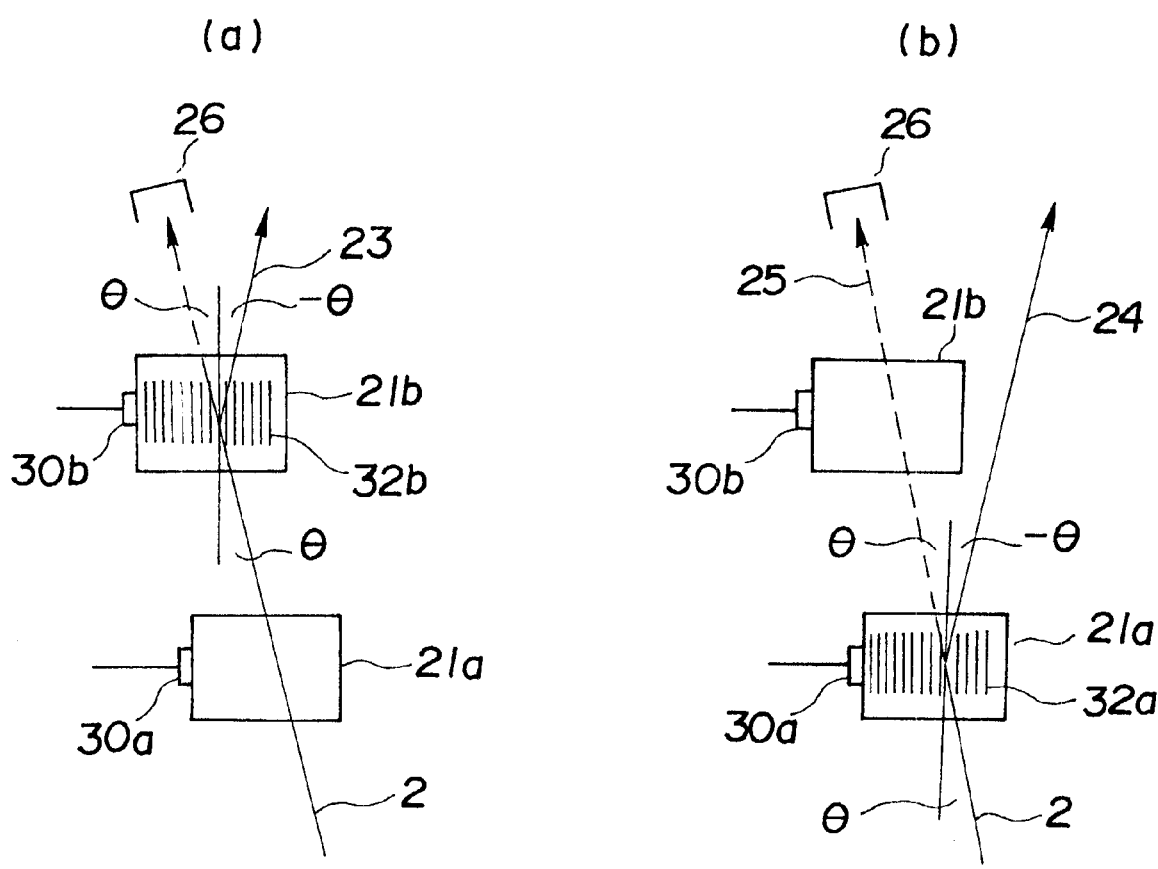
FIG. 4 is a partially plan view of FIG. 1.

Next, the path of the laser beam 2 will be described with reference to FIG. 1 and FIG. 4 which is a partially plan view of FIG. 1.

(1) From time t0 to time t1:

The laser beam 2 penetrates both the beam distributing/shaping units 21a and 21b, and the laser beam 25 enters the heat gathering unit 26 so as to be converted into heat.

(2) From time t1 to time t2 (period $T_{W1}$)

As shown in FIG. 4(a), the optical path of the laser beam 2 is deflected in the beam distributing/shaping unit 21b so that the laser beam 23 enters the galvanomirror 5a, passes an optical path defined by the galvanomirrors 5a and 5b, and is condensed by the condensing lens 6a to thereby machine a hole in the scan area 10a.

(3) From time t2 to time t4:

The laser beam 2 penetrates both the beam distributing/shaping units 21a and 21b, and enters, as the laser beam 25, the heat gathering unit 26 so as to be converted into heat and consumed without being scattered to other places.

(4) From time t4 to time t5 (period $T_{W2}$)

As shown in FIG. 4(b), the optical path of the laser beam 2 is deflected in the beam distributing/shaping unit 21a so that the laser beam 24 enters the galvanomirror 5c, passes an optical path defined by the galvanomirrors 5c and 5d, and is condensed by the condensing lens 6b to thereby machine a hole in the scan area 10b.

As described above, in machining in the scan areas 10a and 10b, the period (period $T_G$) required for positioning the galvanomirrors 5a to 5d is the longest. Therefore, if the interval between the period $T_{W1}$ and the next period $T_{W1}$ and the interval between the period $T_{W2}$ and the next period $T_{W2}$ are set to be equal to the period $T_G$ respectively, the machining period can be shortened.

After that, the laser beam 23 and the laser beam 24 are generated alternately or at random by a machining program so as to perform machining in the scan areas 10a and 10b. After the machining in the scan areas 10a and 10b are terminated, the table 9 is moved for machining in the next scan areas 11a and 11b.

In this embodiment, machining is performed in a period when the energy of the laser beam 2 has reached substantially a peak value. Accordingly, the holes become uniform in quality.

In addition, the machining energy quantity can be controlled accurately because it is not affected by the rising period $T_R$ and the falling period $T_D$. Accordingly, the holes become uniform in quality.

Further, because each of the starting and stopping speeds is not longer than 1 μs in an acousto-optic beam distributing/shaping unit, it is possible to achieve machining in which the pulse width $T_{W1}$ (or $T_{W2}$) is in a range of from 1 μs to 15 μs. Such machining was hitherto impossible.

In addition, galvanomirrors are positioned in one head while machining is performed by the other head. As a result, one beam pulse can be supplied to one head so that the galvanomirrors can be operated even in the rising period $T_R$ and in the falling period $T_D$ in which galvanomirrors could not be hitherto operated. It is therefore possible to reduce waiting time of the laser oscillator so that it is possible to improve the operating efficiency of the laser oscillator. In addition, the capacity of the laser oscillator may be equal to that in the background art.

Further, because each pulse period can be varied, machining can be performed even if the diameter of a hole to be machined in the scan area 10a differs from that in the scan area 10b or even if the number of holes to be machined in the scan area 10a differs from that in the scan area 10b.

Further, beam distributing/shaping units may be prepared correspondingly to the number of heads. Desirable number of heads may be provided.

MACHINING EXAMPLE

Description will be made below about specific perforating rates in the case where the present invention is applied to multi-head machining.

When holes having one and the same shape are machined by one head (that is, $T_P = T_{P1} = T_{P2}$, and $T_W = T_{W1} = T_{W2}$), assume that the number of holes to be machined is A and the number of pulses required per hole is n. Then, machining period $T_B$ for burst machining is expressed by:

$$T_B = A(T_G + (n-1)T_P + T_W)$$

On the other hand, machining period $T_C$ for cycle machining is expressed by:

$$T_C = An(T_G + T_W)$$

Assume that the number of heads is M, the table positioning period is $T_{XY}$, and the number of times to move the table is B. Then, machining period $T_{BM}$ for burst machining is expressed by:

$$T_{BM} = (T_B + BT_{XY})/M$$

Machining period $T_{CM}$ for cycle machining is expressed by:

$$T_{CM} = (T_C + BT_{XY})/M$$

Next, description will be made about an example of calculation of machining period in the case where holes the number of which is A are machined in a printed board measuring 500 mm by 350 mm under the conditions of $T_W = 0.01$ ms and n=3 pulses/hole. Then, assume that the galvano-scan area measures 50 mm by 50 mm (the number of times to move the table is 70), the galvanomirror positioning period TG is 2 ms, the table positioning period $T_{XY}$ is 200 ms, and the maximum pulse frequency of the laser oscillator is 3 KHz (the minimum pulse frequency is 0.33 ms).

(1) The case where burst machining is performed by a direct method (see FIG. 5)

(b1) Assume that the number M of heads is 2 and the machining period of each head is 1 ms. In this case, when a first pulse for a head 2 is allocated between a second pulse and a third pulse for a head 1 as shown in FIG. 5(a), each head can perform machining in a machining pulse period $T_P = 1.0$ ms (frequency: 1 KHz). Then, the period of laser pulses in the second pulse period and the third pulse period for the head 1 is 0.5 ms.

Accordingly, machining is terminated with $T_{MB} = T_{2B} = 27.1$ seconds (the perforating rate is 369 holes/second or 22,140 holes/minute) in the case of A=10,000 and in $T_{2B} = 47.1$ seconds (the perforating rate is 424 holes/second or 25,440 holes/minute) in the case of A=20,000.

(b2) Assume that the number M of heads is 2 and the machining pulse period of each head is 0.5 ms. In this case, as shown in FIG. 5(b), one head is positioned while machining is performed by the other head. Thus, machining can be achieved in a machining pulse period $T_P = 0.5$ ms (frequency: 2 KHz).

Accordingly, machining can be attained in $T_{2B} = 22.1$ seconds (the perforating rate is 453 holes/second or 27,180 holes/minute) in the case of A=10,000 and in $T_{2B} = 37.1$ seconds (the perforating rate is 539 holes/second or 32,340 holes/minute) in the case of A=20,000.

(b3) In the case where the number M of heads is 2 and the machining pulse period of each head is 0.33 ms, machining is terminated in $T_{2B} = 20.4$ seconds (the perforating rate is 490 holes/second or 27,400 holes/minute) in the case of A=10,000 and in $T_{2B} = 33.8$ seconds (the perforating rate is 592 holes/second or 35,520 holes/minute) in the case of A=20,000.

Incidentally, as shown in FIG. 5(c), in the case where the machining pulse period is 0.33 ms, assume that the number M of heads is 3, the galvano-period is 2.33 ms, and two heads are positioned while machining is performed by the other one head. Thus, machining can be achieved in a machining pulse period $T_P = 0.33$ ms (frequency: 3 KHz).

Accordingly, machining is terminated in $T_{3B} = 14.7$ seconds (the perforating rate is 680 holes/second or 40,800 holes/minute) in the case of A=10,000 and in $T_{3B} = 24.7$ seconds (the perforating rate is 809 holes/second or 48,540 holes/minute) in the case of A=20,000.

The case where cycle machining is performed by a conformal mask method (see FIG. 6):

(c1) In the case where the number M of heads is 2, as shown in FIG. 6(a), when the laser pulse period is set to be 1 ms, machining can be performed by the heads 1 and 2 alternately.

Accordingly, machining is terminated in $T_{2C} = 37.2$ seconds (the perforating rate is 269 holes/second or 16,140 holes/minute) in the case of A=10,000 and in $T_{2C} = 67.3$ seconds (the perforating rate is 297 holes/second or 17,820 holes/minute) in the case of A=20,000.

(c2) In the case where the number M of heads is 3, as shown in FIG. 6(b), when the laser pulse period is set to be 0.67 ms, machining can be performed by the heads alternately.

Accordingly, machining is terminated in $T_{3B} = 24.8$ seconds (the perforating rate is 403 holes/second or 24,180 holes/minute) in the case of A=10,000 and in $T_{3B} = 44.9$ seconds (the perforating rate is 445 holes/second or 26,700 holes/minute) in the case of A=20,000. The maximum perforating rate is 27,550 holes.

(c3) In the case of four heads, as shown in FIG. 6(c), when the laser pulse period is set to be 0.5 ms, machining can be performed by the heads 1 to 4 alternately.

Accordingly, machining is terminated in $T_{4B} = 18.6$ seconds (the perforating rate is 538 holes/second or 32,280 holes/minute) in the case of A=10,000 and in $T_{4B} = 33.7$ seconds (the perforating rate is 594 holes/second or 35,640 holes/minute) in the case of A=20,000.

Figure 7:
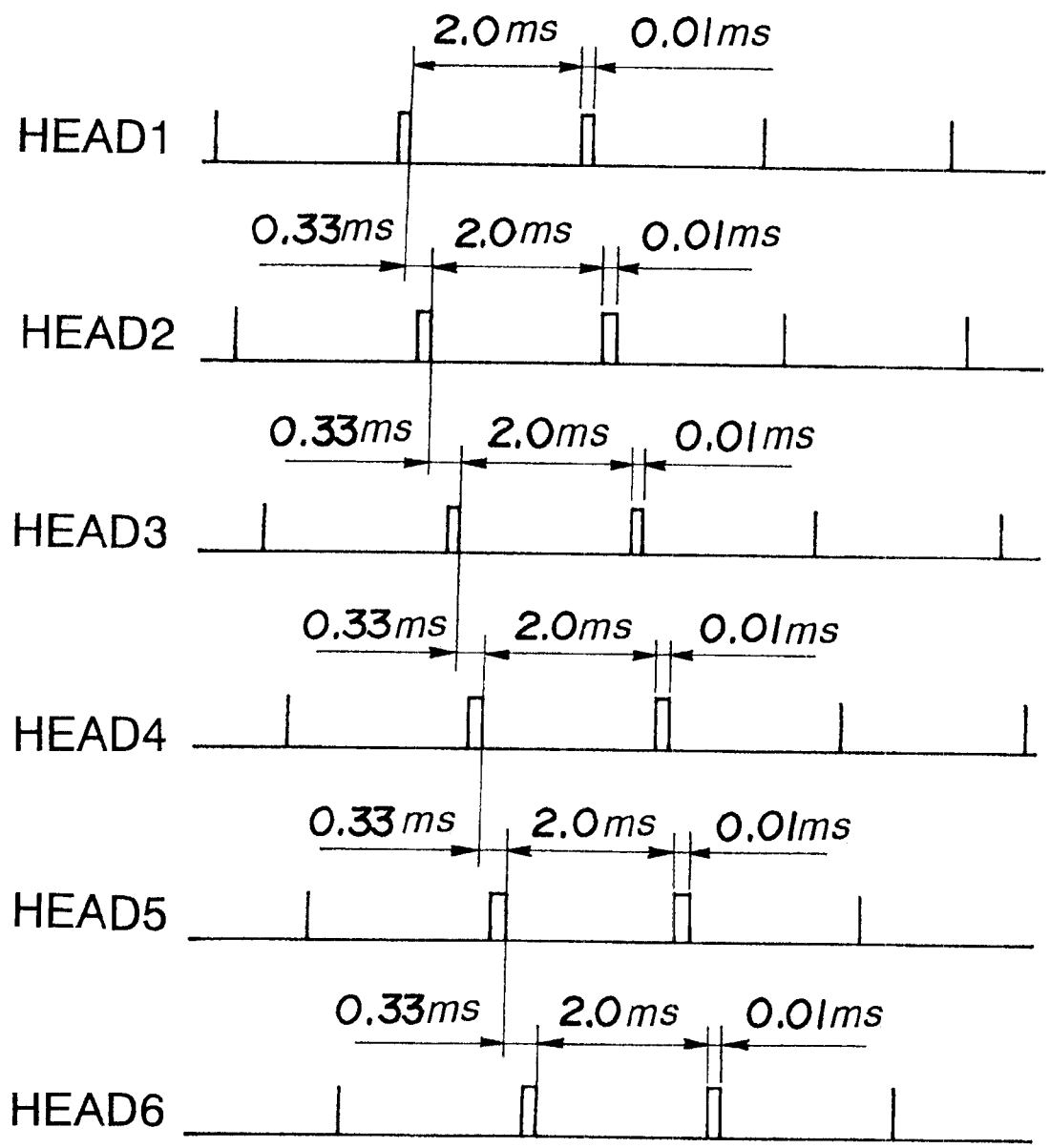
FIG. 7 is a timing chart showing another example of machining when cycle machining is performed by a conformal mask method according to the present invention.

(c4) In the case of six heads, as shown in FIG. 7, when the laser pulse period is set to be 0.33 ms (frequency: 3.0 KHz), machining can be performed by the heads alternately.

Accordingly, machining is terminated in $T_{6B} = 12.4$ seconds (the perforating rate is 808 holes/second or 48,420 holes/minute) in the case of A=10,000 and in $T_{6B} = 22.4$ seconds (the perforating rate is 891 holes/second or 53,460 holes/minute) in the case of A=20,000.

Although description was made about the case where all the laser energy in the period $T_{W1}$ or $T_{W2}$ is supplied to the portion to be machined in FIG. 3, the period $T_{W1}$ or $T_{W2}$ may be time-divided so that a part of the laser energy is supplied to the portion to be machined.

FIG. 8 is a timing chart of respective portions in burst machining according to another embodiment of the present invention. Incidentally, a laser machine has the same configuration as that in FIG. 1. In FIG. 8, (a) designates a start signal for a laser oscillator; (b) designates a start signal for a beam distributing/shaping unit 21b; (c) designates a positioning signal for galvanomirrors 5a and 5b; (d) designates a start signal for a beam distributing/shaping unit 21a; (e) designates a positioning signal for galvanomirrors 5c and 5d; and (f) designates the energy of a laser beam 2.

An NC unit 7 turns a laser oscillator 1 ON in a period $T_{P1}$ (from time t0 to time t2), in a period $T_{P2}$ (from time t3 to time t5), and in a period $T_{P3}$ (from time t6 to time t8). After a delay period $T_{DL}$ has passed since any of the periods $T_{P1}$, $T_{P2}$ and the period $T_{P3}$ was started, the energy of the laser beam 2 increases gradually. After a period $T_R$ has passed, the energy of the laser beam 2 reaches a peak value $W_P$. Then, after any of the periods $T_{P1}$, $T_{P2}$ and the period $T_{P3}$ was terminated, the energy of the laser beam 2 decreases gradually. After a period $T_D$ has passed (here, immediately before the time t3 or the time t6 and during a period $T_G$), the energy of the laser beam 2 reaches 0.

The beam distributing/shaping unit 21a is turned ON only for a period $T_{W11}$ (for example, 0.02 ms) from the time t1, the time t4 and the time t7 when the energy of the laser beam 2 substantially reaches the peak value $W_P$. On the other hand, the beam distributing/shaping unit 21b is turned ON only for a period $T_{W21}$ (for example, 0.02 ms) after a period $T_{dW}$ has further passed since the time when the period $T_{W11}$ had passed. Here, the time when the period $T_{W21}$ is terminated is set to coincide with the time t2, t4 and t8. Then, after the galvanomirrors 5a, 5b, 5c and 5d are positioned in the next machining positions in the period $T_G$ from the time t8, the above-mentioned operation is repeated. In this embodiment, since the galvanomirrors 5a, 5b, 5c and 5d are positioned simultaneously, it becomes easy to control the positioning of the galvanomirrors. In addition, the frequency of laser pulses supplied to the portion to be machined can be made high in the state where the output frequency of the laser oscillator 1 is fixed.

Figure 9:
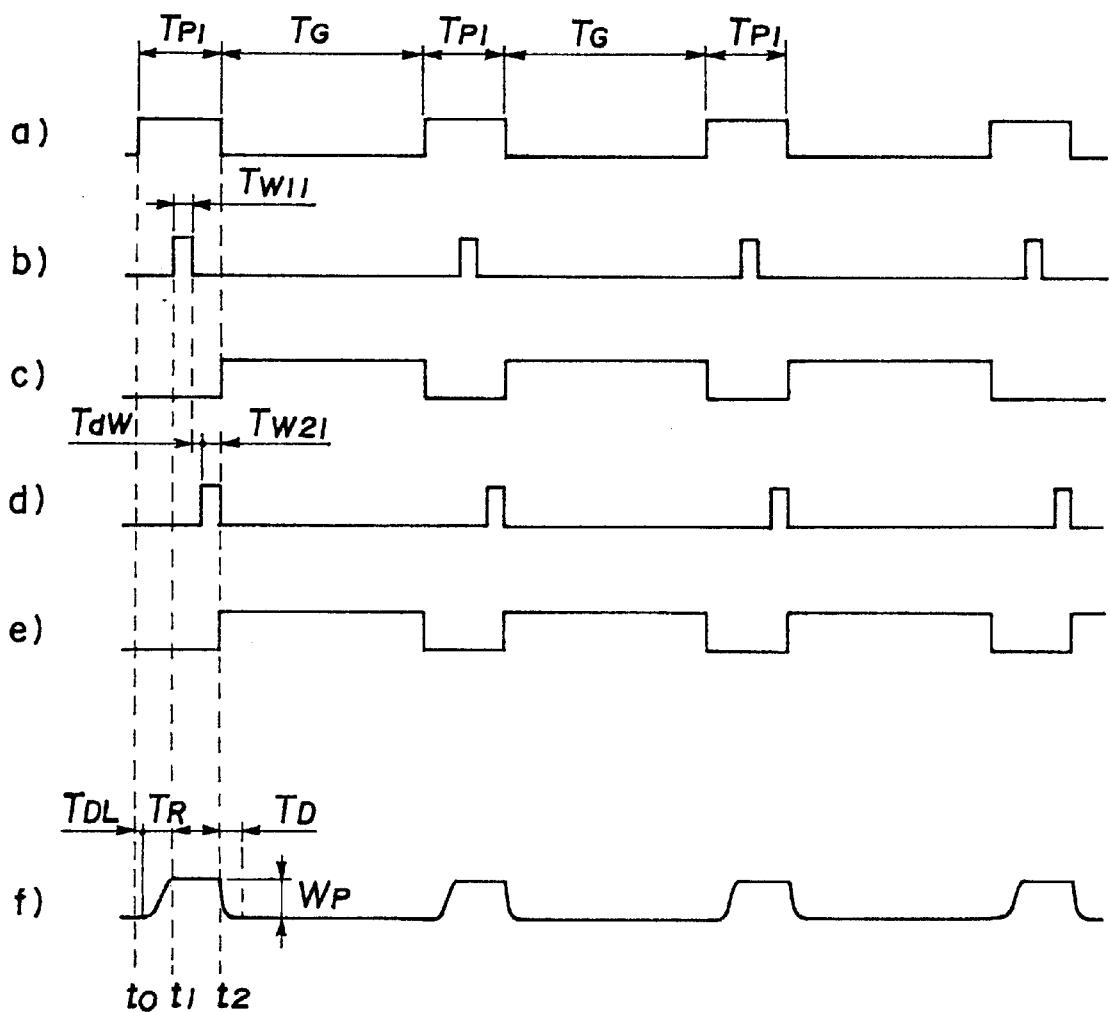
FIG. 9 is a timing chart showing the operation timing of respective portions in cycle machining according to the present invention.
Figure 11:
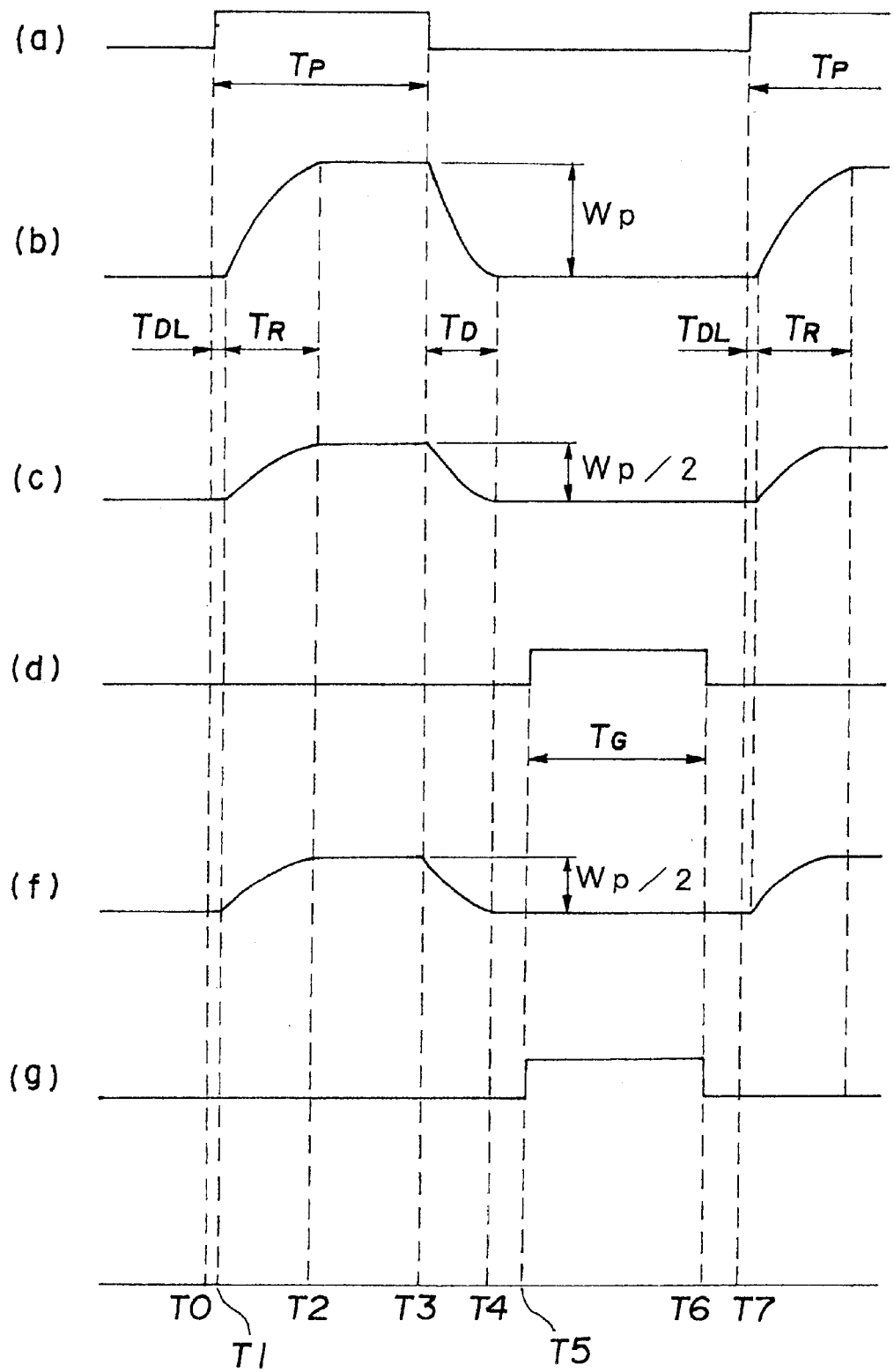
FIG. 11 is a timing chart showing the operation timing of respective portions in cycle machining in the background art.

FIG. 9 is a timing chart of respective portions in cycle machining according to a further embodiment of the present invention. Incidentally, a laser machine has the same configuration as that in FIG. 1. In FIG. 9, (a) designates a start signal for a laser oscillator; (b) designates a start signal for a beam distributing/shaping unit 21b; (c) designates a positioning signal for galvanomirrors 5a and 5b; (d) designates a start signal for a beam distributing/shaping unit 21a; (e) designates a positioning signal for galvanomirrors 5c and 5d; and (f) designates the energy of a laser beam 2.

An NC unit 7 turns a laser oscillator 1 ON in a period $T_{P1}$ (from time t0 to time t2). After a delay period $T_{DL}$ has passed since the period $T_{P1}$ was started, the energy of the laser beam 2 increases gradually. After a period $T_R$ has passed, the energy of the laser beam 2 reaches a peak value $W_P$. Then, after the period $T_{P1}$ was terminated, the energy of the laser beam 2 decreases gradually. After a period $T_D$ in a period $T_G$ has passed, the energy of the laser beam 2 reaches 0.

The beam distributing/shaping unit 21a is turned ON only for a period $T_{W11}$ (for example, 0.02 ms) from the time t1 when the energy of the laser beam 2 reaches substantially the peak value $W_P$. On the other hand, the beam distributing/ shaping unit 21b is turned ON only for a period $T_{W21}$ (for example, 0.02 ms) after a period $T_{dW}$ has further passed since the time when the period $T_{W11}$ had passed. Here, the time when the period $T_{W21}$ is terminated is set to coincide with the time t2. Then, after the galvanomirrors 5a, 5b, 5c and 5d are positioned in the next machining positions in the period $T_G$ from the time t2, the above-mentioned operation is repeated. Also in this embodiment, since the galvanomirrors 5a, 5b, 5c and 5d are positioned simultaneously, it becomes easy to control the positioning of the galvanomirrors.

Incidentally, for example, in the case where both a laser beam 23 and a laser beam 24 are outputted between the time t1 and the time t2 in the period $T_{P1}$, the energy of the laser beam 23 becomes a little smaller than the energy of the laser beam 24 due to energy loss in the distributing/shaping unit 21b. Therefore, when holes the machining conditions of which are the same as each other are machined by a head 7a and a head 7b, the period $T_{W21}$ may be set to be longer than the period $T_{W11}$ so that the total quantity of energy supplied to each portion to be machined is the same. Alternatively, the respective output voltages of transducers 30a and 30b may be controlled so that the magnitude of the respective energies of the laser beams 23 and 24 are varied.

Also in this further embodiment, machining is performed in a period when the energy of the laser beam 2 reaches substantially a peak value. Accordingly, the holes become uniform in quality.

In addition, the machining energy quantity can be controlled accurately because it is not affected by the rising period $T_R$ and the falling period $T_D$. Accordingly, the holes become uniform in quality.

Further, because each of the starting and stopping speeds is not longer than 1 μs in an acousto-optic beam distributing/shaping unit, it is possible to achieve machining in which the pulse width $T_{W1}$ (or $T_{W2}$) is in a range of from 1 μs to 15 μs. Such machining was hitherto impossible.

Moreover, also when a pulse is time-divided, each time-divided pulse can be set to have a desirable pulse period. Accordingly, machining can be performed even in the case where the diameter of a hole in the scan area 10a is different from that in the scan area 10b, or even in the case where the number of holes to be machined in the scan area 10a is different from that in the scan area 10b.

In addition, it will go well if beam distributing/shaping units the number of which corresponds to the number of heads are prepared. Accordingly, it is possible to set the number of heads desirably.

Although the incident angle and the transmission and reflection angle of the beam distributing/shaping unit are made the same as each other in each of the above-mentioned cases, a deflector in which a plurality of transducers the number of which is the same as the number of heads are disposed to be shifted in phase from one another, may be used to change over the level with which an ultrasonic wave is applied. In this case, ultrasonic wave surfaces are shifted in the rotation direction so that N beams of transmitted and reflected light with a fixed incident angle and an outgoing angle θN (θN=λΔF/V, ΔF: ultrasonic wave frequency, V: ultrasonic wave propagation rate) are radiated.

In addition, a laser pulse may be shaped by the beam distributing/shaping unit, and the optical path may be deflected by polygonal mirrors.

Further, although $CO_2$ laser machining was described above by way of example, the present invention can be applied to a laser having another wavelength if optical material and an acousto-optic unit corresponding to the laser wavelength are used.

INDUSTRIAL UTILIZATION

As has been described above, according to the present invention, optical path deflecting means which can deflect an optical path of the laser beam is disposed on the optical path of the laser beam, the laser energy supplied to a portion to be machined is controlled by the optical path deflecting means, and machining is performed in a period when the energy of a laser beam has reached substantially a peak value. Accordingly, the machining energy quantity can be controlled accurately because it is not affected by a rising period $T_R$ and a falling period $T_D$. As a result, it is possible to machine a hole which is superior in quality.

Further, galvanomirrors are positioned in one head while machining is performed by the other head. As a result, one beam pulse can be supplied to one head so that the galvanomirrors can be operated even in the rising period $T_R$ and in the falling period $T_D$ in which galvanomirrors could not be hitherto operated. It is therefore possible to reduce waiting time of a laser oscillator so that it is possible to improve the operating efficiency of the laser oscillator.

In addition, by varying each pulse period or further time-dividing a pulse period, machining becomes easy even if holes to be machined in a scan area for each head differ in diameter form one another or even if the number of holes to be machined in a scan area for one head differs from that in a scan area for another. In addition, it is possible to set the number of heads desirably.

What is claimed is:

1. A laser machining method in which optical path deflecting means for deflecting an optical path of a laser beam is disposed on said optical path of said laser beam, and laser energy supplied to a portion to be machined is controlled by said optical path deflecting means, said laser beam being composed of a pulsed $CO_2$ laser beam, said optical path deflecting means being formed by first and second stages of acousto-optic elements disposed in series, the laser beam from said first stage entering said second stage, comprising:

forming said laser beam to be supplied to said portion to be machined into a substantially rectangular waveform having a substantially uniform peak energy range, and using the range where peak energy of said laser beam to be supplied to said portion to be machined becomes substantially uniform for machining.

2. A laser machine in which a laser beam outputted from a laser oscillator is supplied to a plurality of machining heads, comprising:

beam distributing/shaping units disposed in series, the number of said beam distributing/shaping units being equal to the number of said machining heads, wherein each of said beam distributing/shaping units deflects an optical path of said laser beam, supplies a pulsed $CO_2$ laser beam radiated from said laser oscillator to one of said machining heads, and includes an acousto-optic element for shaping said laser beam to be supplied into a substantially rectangular waveform having a substantially uniform peak energy range, and wherein the range in which peak energy of said laser beam to be supplied to said portion to be machined becomes substantially uniform is used for machining.

* * * * *